United States Patent
Khaderbad et al.

(10) Patent No.: US 11,201,232 B2
(45) Date of Patent: Dec. 14, 2021

(54) SEMICONDUCTOR STRUCTURE WITH METAL CONTAINING LAYER

(71) Applicant: Taiwan Semiconductor Manufacturing Co., Ltd., Hsinchu (TW)

(72) Inventors: Mrunal A. Khaderbad, Hsinchu (TW); Sung-Li Wang, Zhubei (TW); Yasutoshi Okuno, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/931,590

(22) Filed: Jul. 17, 2020

(65) Prior Publication Data
US 2020/0350421 A1 Nov. 5, 2020

Related U.S. Application Data

(63) Continuation of application No. 16/151,784, filed on Oct. 4, 2018, now Pat. No. 10,797,161.

(60) Provisional application No. 62/718,821, filed on Aug. 14, 2018.

(51) Int. Cl.
*H01L 29/66* (2006.01)
*H01L 21/3213* (2006.01)
(Continued)

(52) U.S. Cl.
CPC .. *H01L 29/66795* (2013.01); *H01L 21/02244* (2013.01); *H01L 21/0332* (2013.01); *H01L 21/28568* (2013.01); *H01L 21/31111* (2013.01); *H01L 21/32139* (2013.01); *H01L 21/76802* (2013.01); *H01L 21/76834* (2013.01); *H01L 21/76877* (2013.01); *H01L 21/76888* (2013.01); *H01L 21/76897* (2013.01); *H01L 29/0847* (2013.01); *H01L 29/665* (2013.01); *H01L 21/02175* (2013.01); *H01L 21/02181* (2013.01); *H01L 21/02186* (2013.01);
(Continued)

(58) Field of Classification Search
None
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |

(Continued)

*Primary Examiner* — Steven M Christopher
(74) *Attorney, Agent, or Firm* — Birch, Stewart, Kolasch & Birch, LLP

(57) ABSTRACT

Semiconductor structures and method for forming the same are provided. The semiconductor structure includes a substrate and a gate structure formed over the substrate. The semiconductor structure further includes a source/drain structure formed adjacent to the gate structure in the substrate and a contact formed over the source/drain structure. The semiconductor structure further includes a metal-containing layer formed over the contact and a dielectric layer covering the gate structure and the metal-containing layer. The semiconductor structure further includes a first conductive structure formed through dielectric layer and the metal-containing layer and landing on the contact. In addition, a bottom surface of the metal-containing layer is higher than a top surface of the gate structure.

20 Claims, 16 Drawing Sheets

(51) Int. Cl.
    *H01L 21/768*     (2006.01)
    *H01L 21/311*     (2006.01)
    *H01L 21/033*     (2006.01)
    *H01L 21/02*     (2006.01)
    *H01L 21/285*     (2006.01)
    *H01L 29/08*     (2006.01)

(52) U.S. Cl.
    CPC .... *H01L 29/6656* (2013.01); *H01L 29/66545* (2013.01); *H01L 29/66636* (2013.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2002/0025669 A1* | 2/2002 | Hwang ............. H01L 21/76831 438/637 |
| 2007/0099414 A1* | 5/2007 | Frohberg .......... H01L 23/53238 438/618 |
| 2013/0175583 A1* | 7/2013 | Yuan ................. H01L 21/76895 257/288 |
| 2014/0084340 A1* | 3/2014 | Wang ................. H01L 29/0684 257/190 |
| 2018/0083002 A1* | 3/2018 | Kim ................. H01L 29/66795 |

\* cited by examiner

SEMICONDUCTOR STRUCTURE WITH METAL CONTAINING LAYER

PRIORITY CLAIM AND CROSS-REFERENCE

This application is a Continuation Application of U.S. patent application Ser. No. 16/151,784, filed on Oct. 4, 2018, which claims the benefit of U.S. Provisional Application No. 62/718,821, filed on Aug. 14, 2018, the entirety of which are incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

One of the most important drivers for increased performance in semiconductor devices is the higher degree of circuit integration. This may be accomplished by using structures such as FinFET structures. A typical FinFET structure includes a vertical fin-shape structure and a gate formed over the fin-shape structure.

However, although existing FinFET manufacturing processes have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
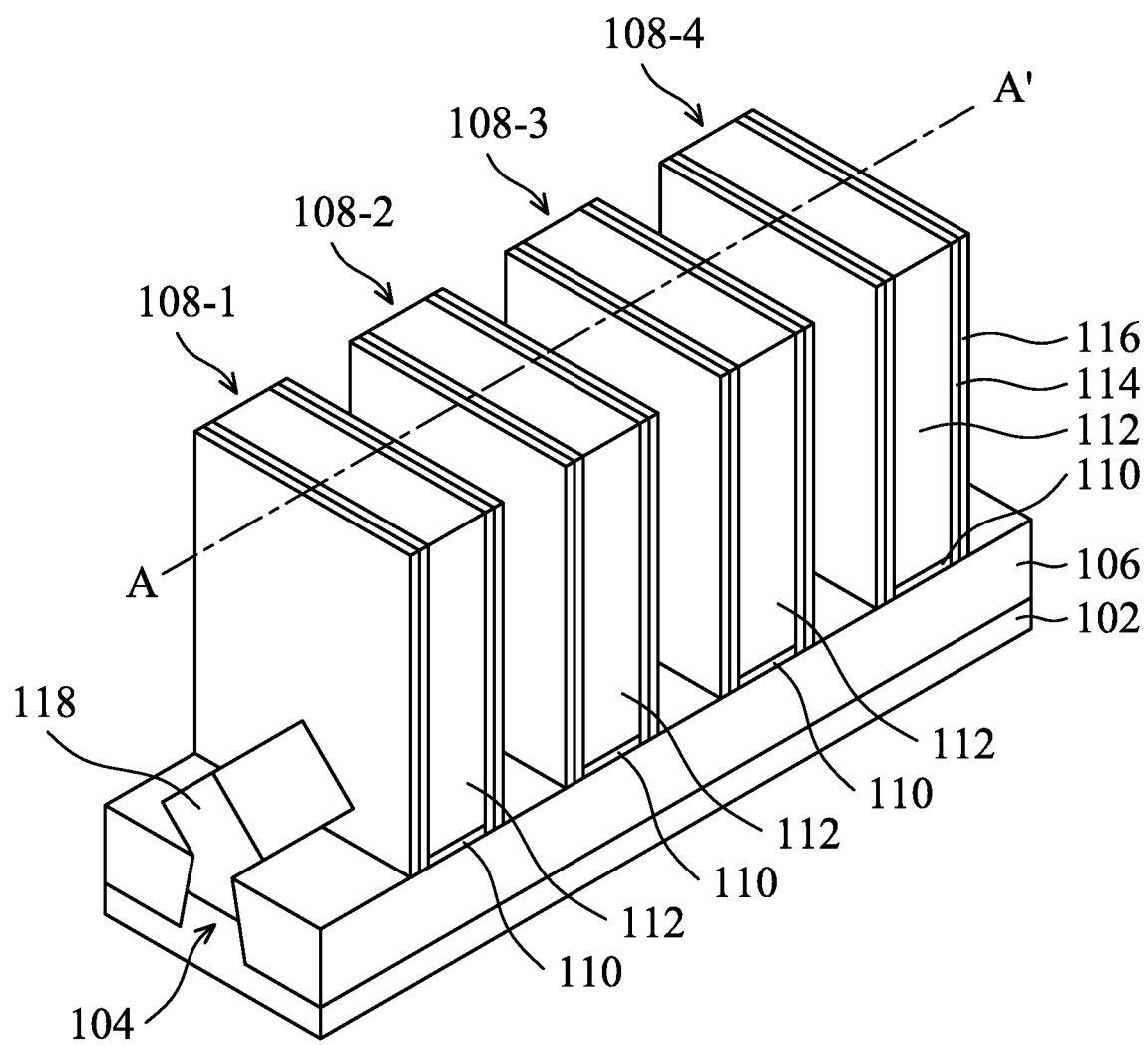
FIGS. 1A to 1D illustrate perspective views of various stages of manufacturing a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Embodiments for manufacturing semiconductor structures are provided. The semiconductor structures may include a gate structure formed over a substrate and a contact formed over a source/drain structure adjacent to the gate structure. A first mask structure may be formed over the gate structure first and a second mask structure may be formed over the contact structure. In addition, the second mask structure may be selectively formed (e.g. deposited) on the contact without performing additional patterning and polishing process, so that the processes for manufacturing the semiconductor structure may be reduced.

Figure 1B:
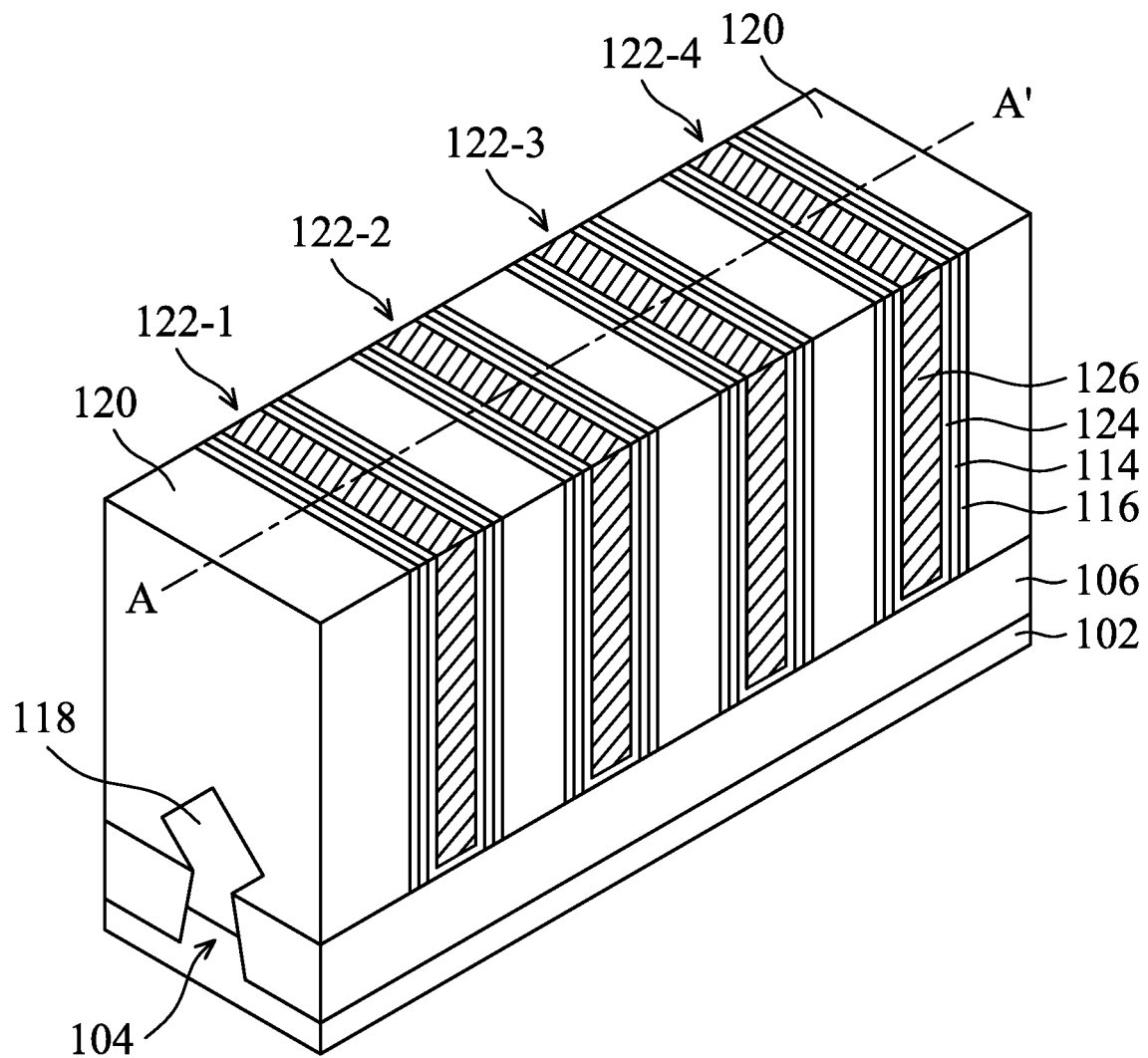
Figure 1C:
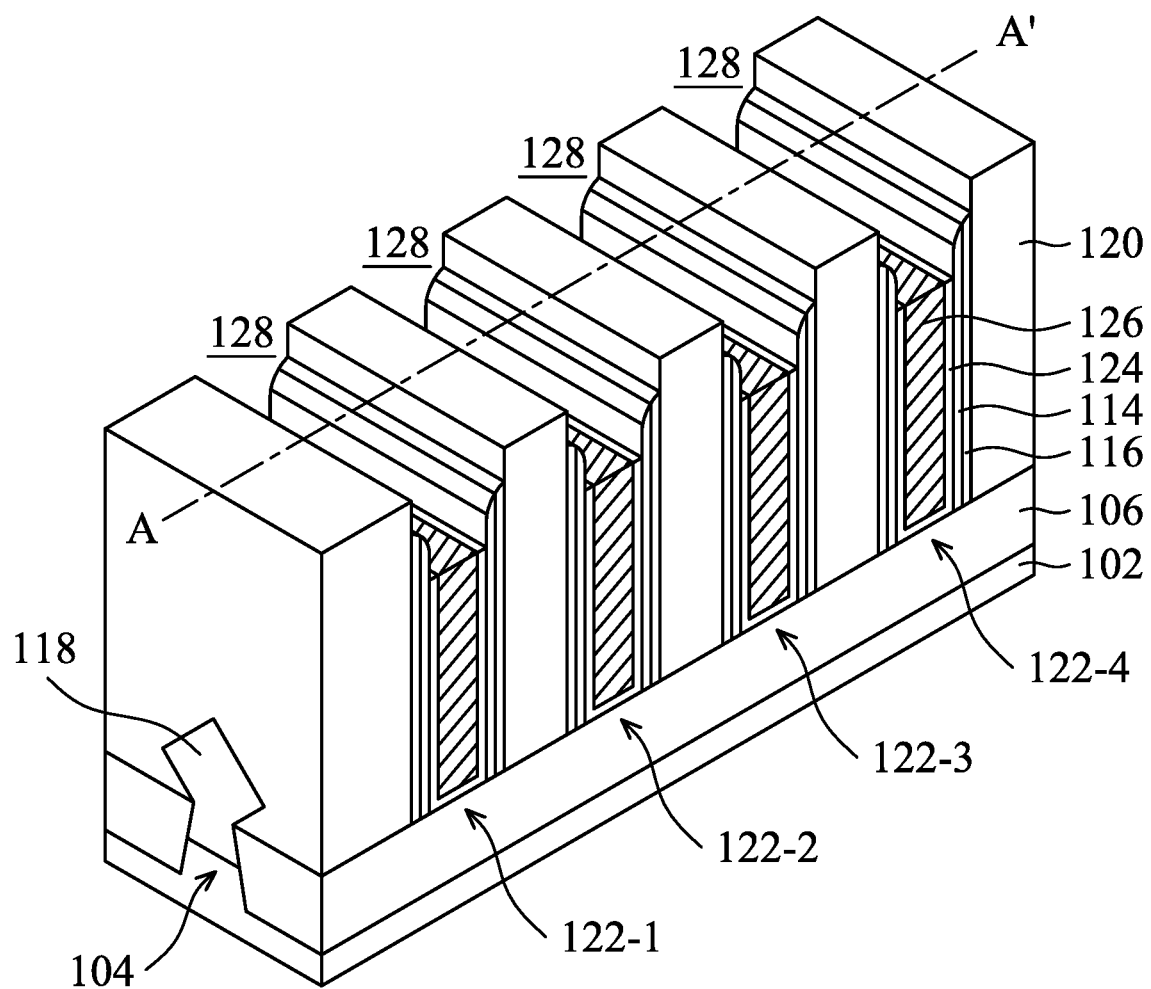
Figure 1D:
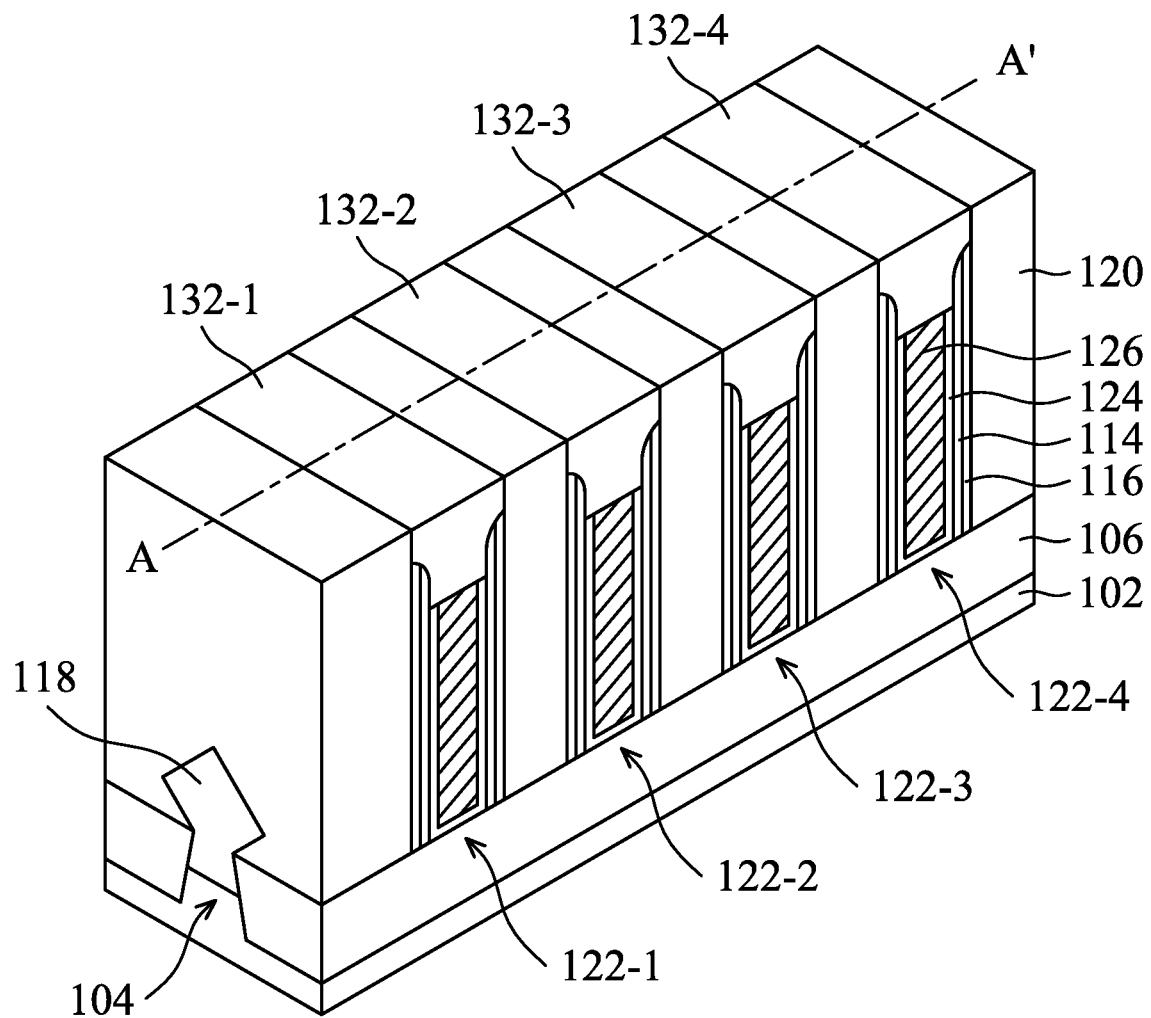
Figure 2A:
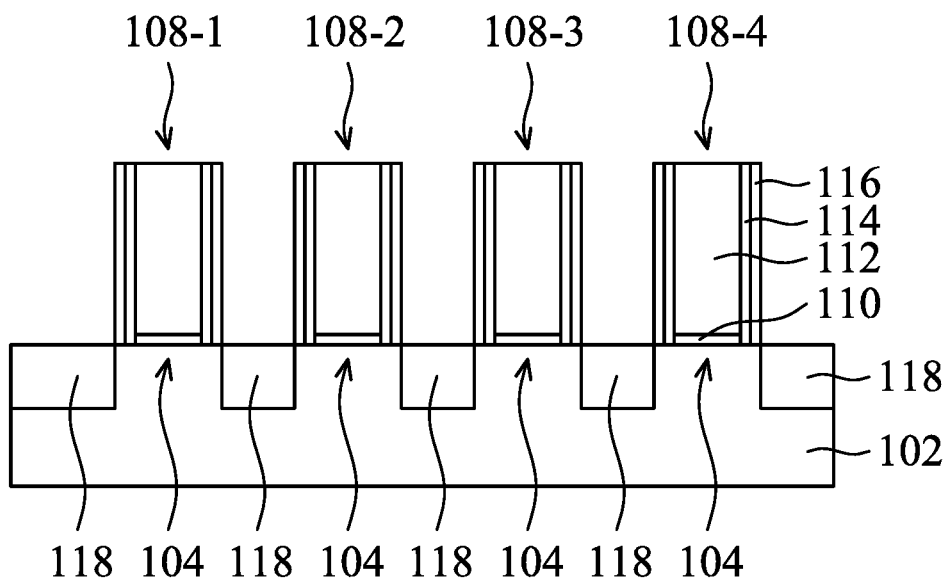
FIGS. 2A to 2P illustrate cross-sectional representations of various stages of manufacturing the semiconductor structure in accordance with some embodiments.
Figure 2B:
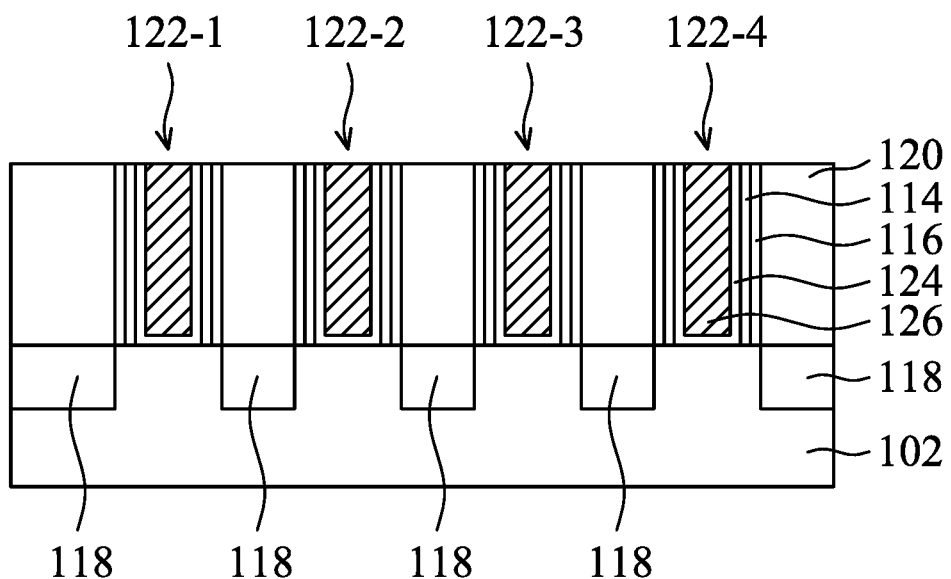
Figure 2C:
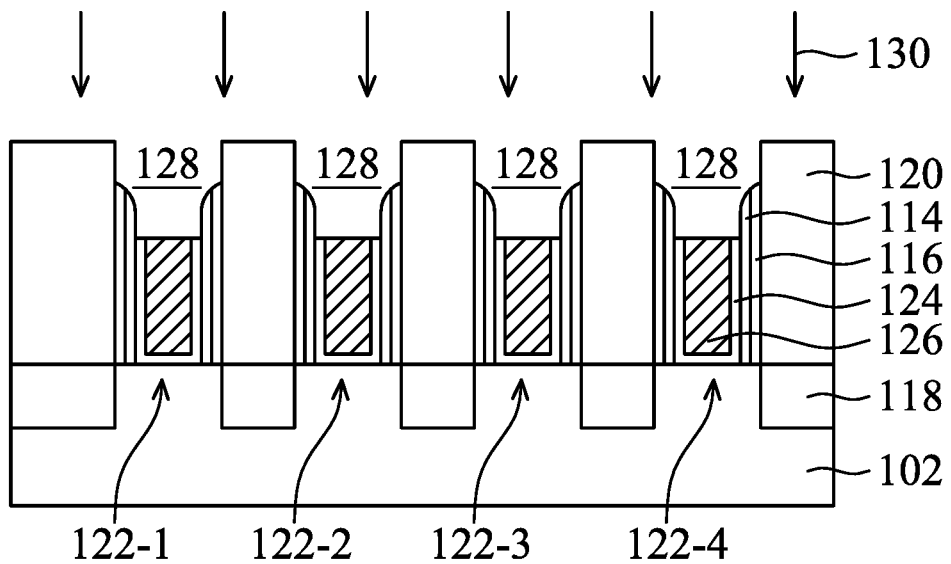
Figure 2D:
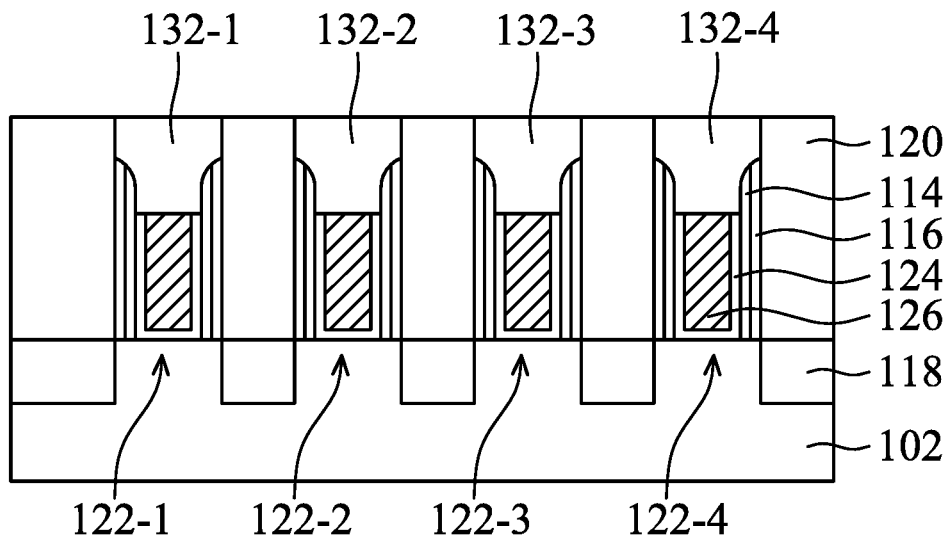
Figure 2E:
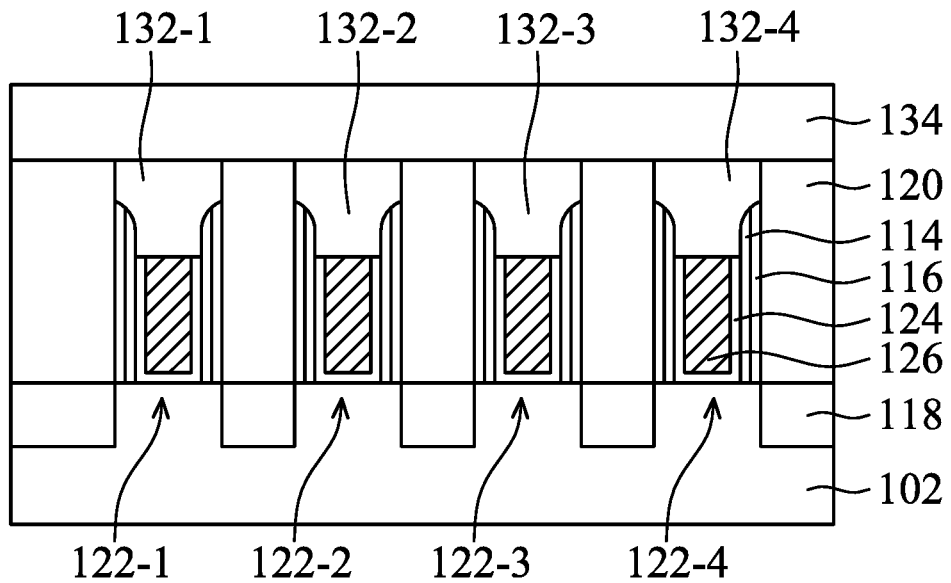
Figure 2F:
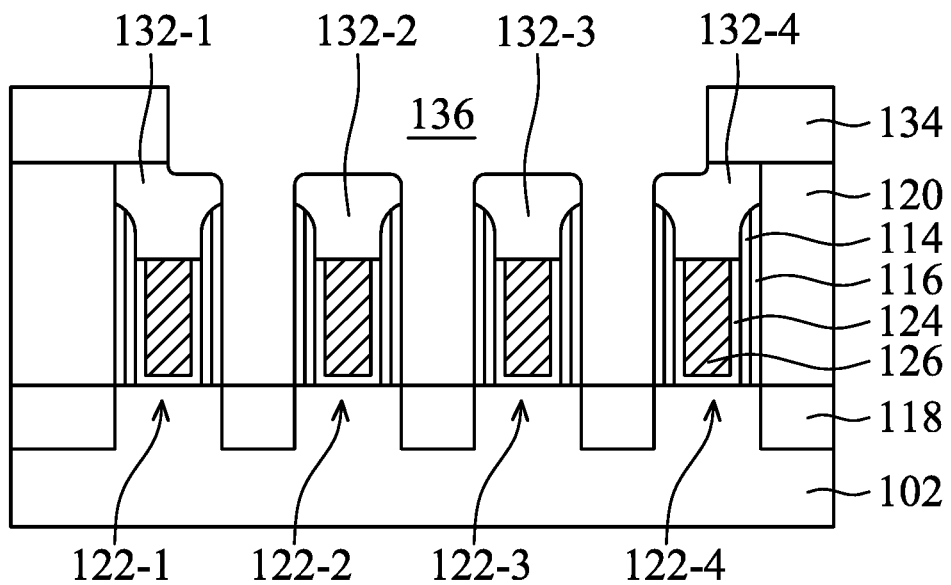
Figure 2G:
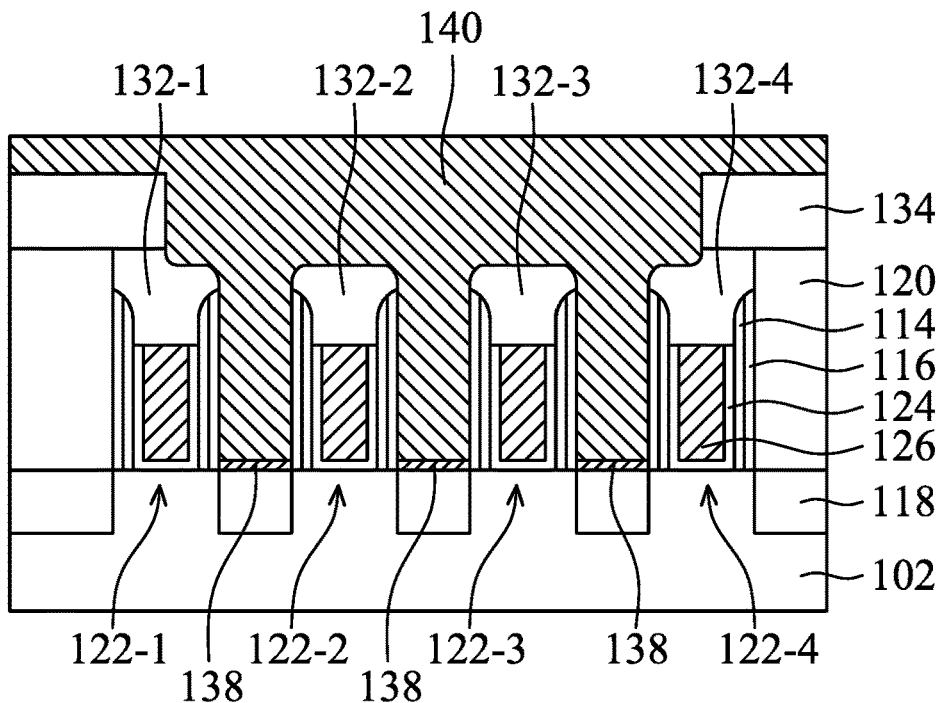
Figure 2H:
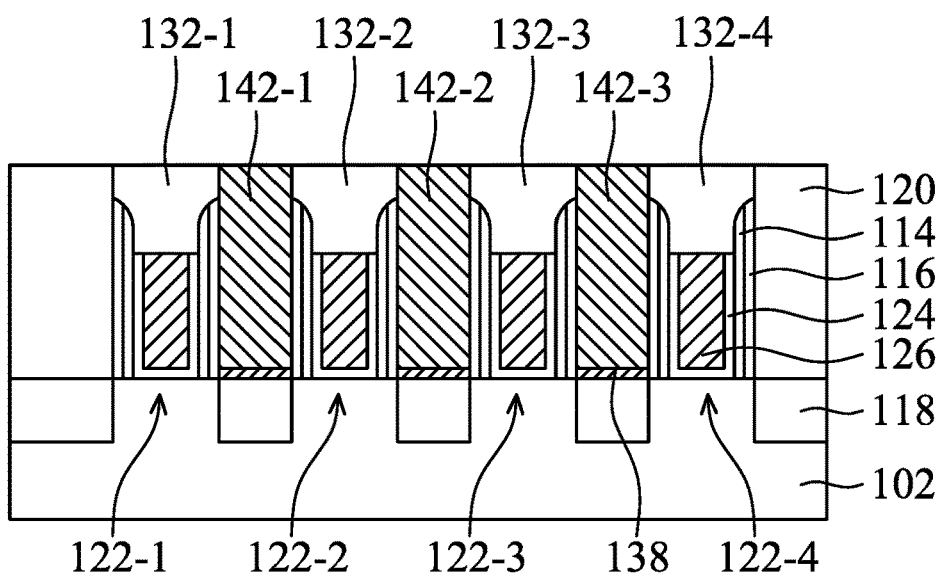
Figure 2I:
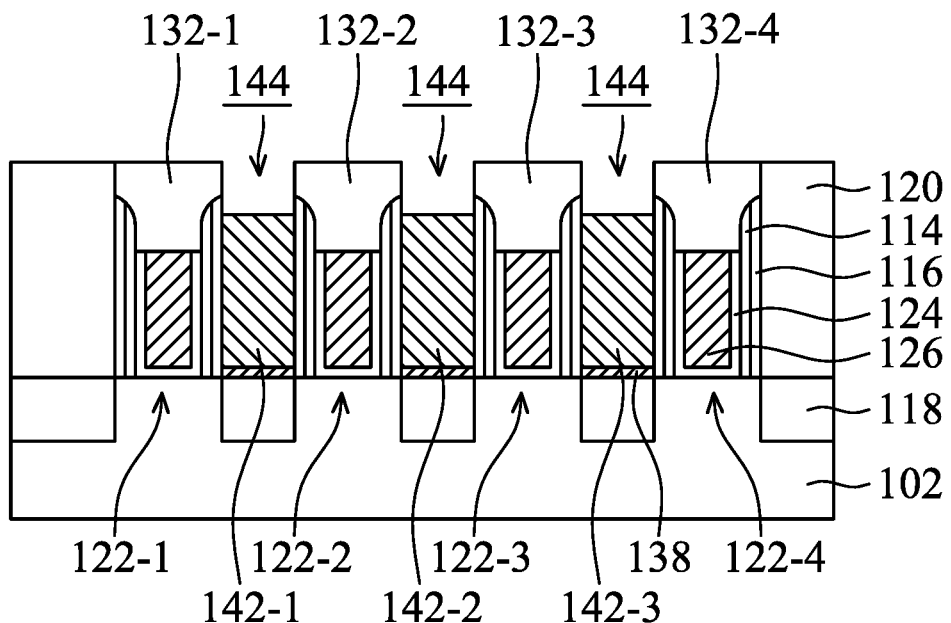
Figure 2J:
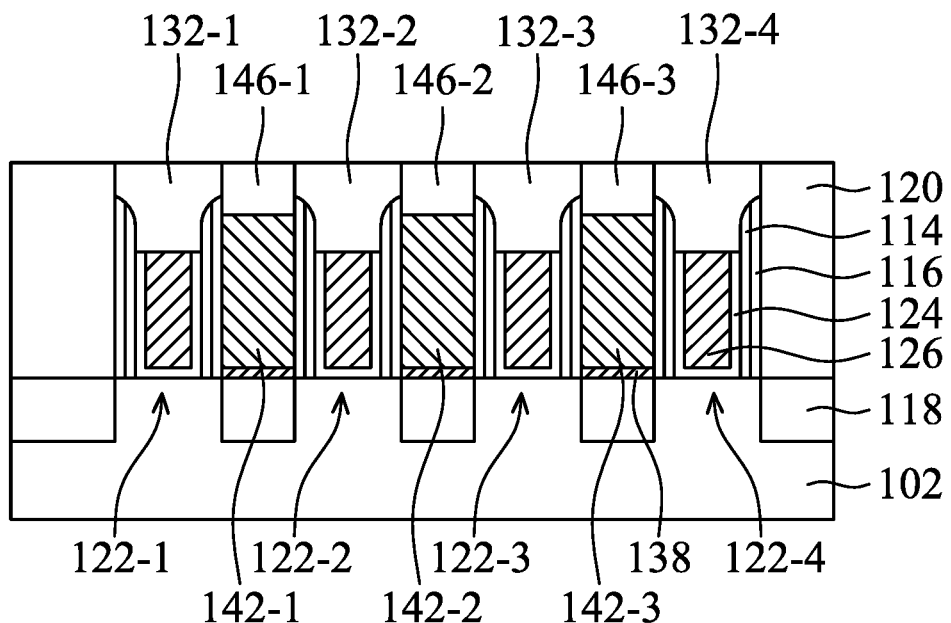
Figure 2K:
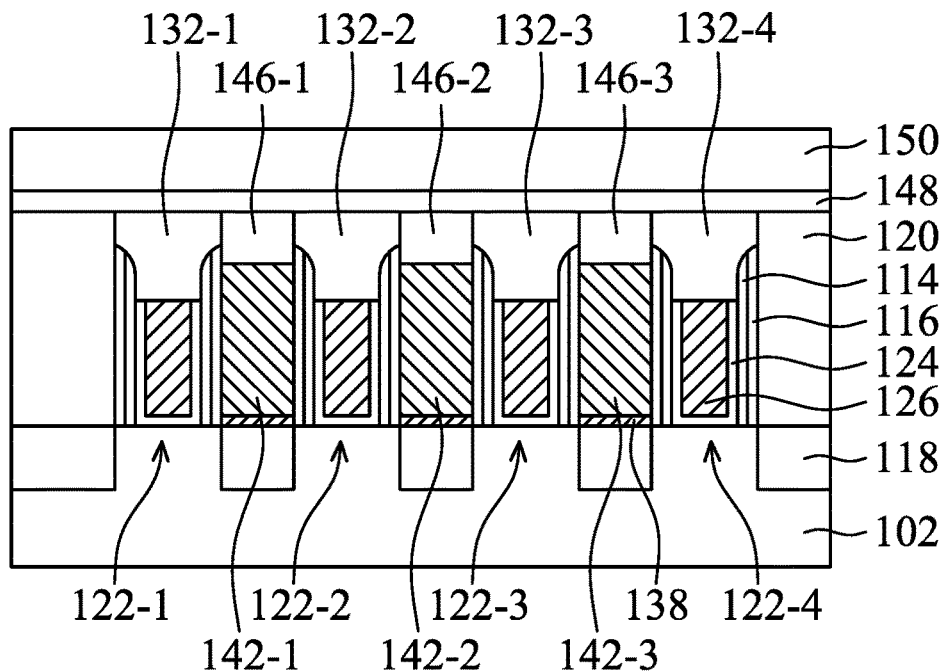
Figure 2L:
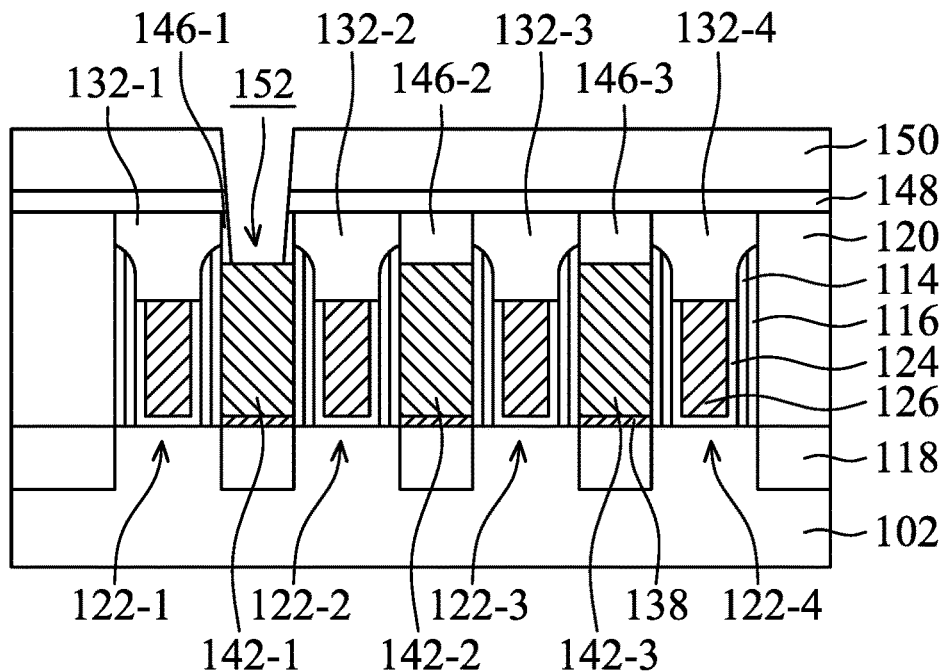
Figure 2M:
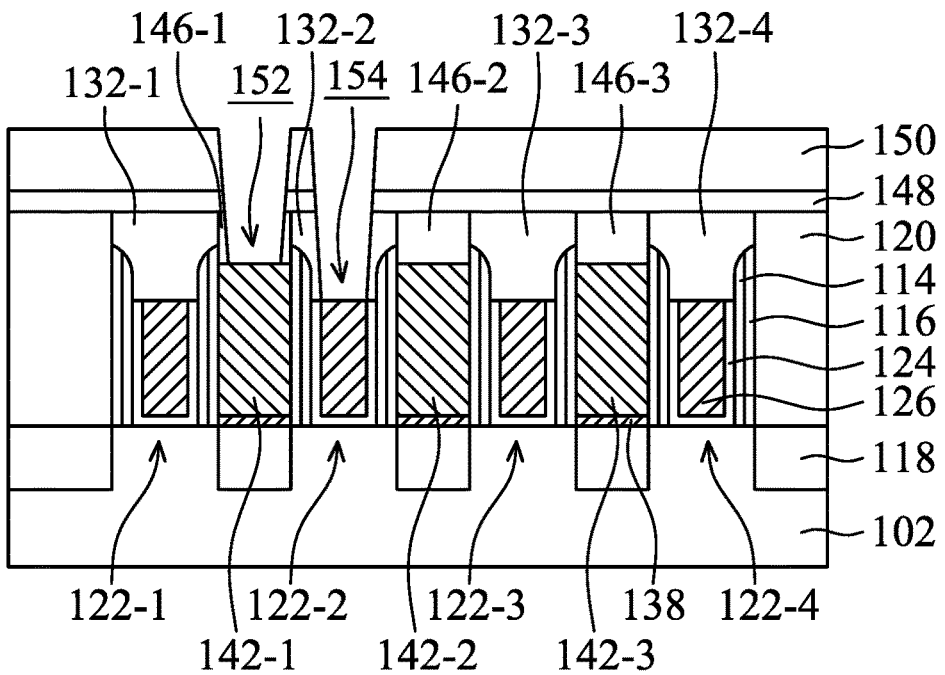
Figure 2N:
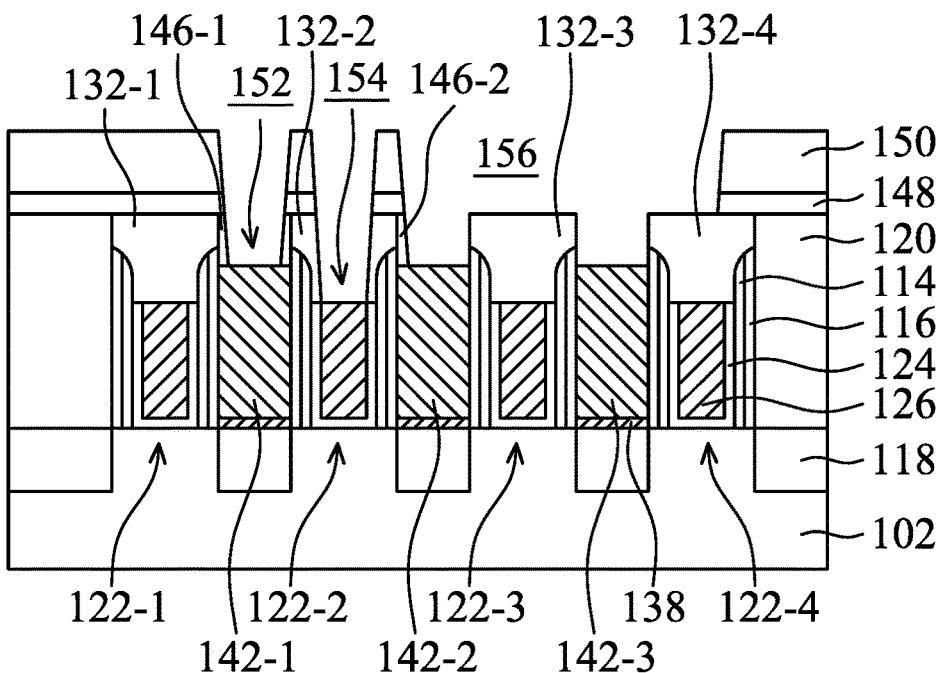
Figure 2O:
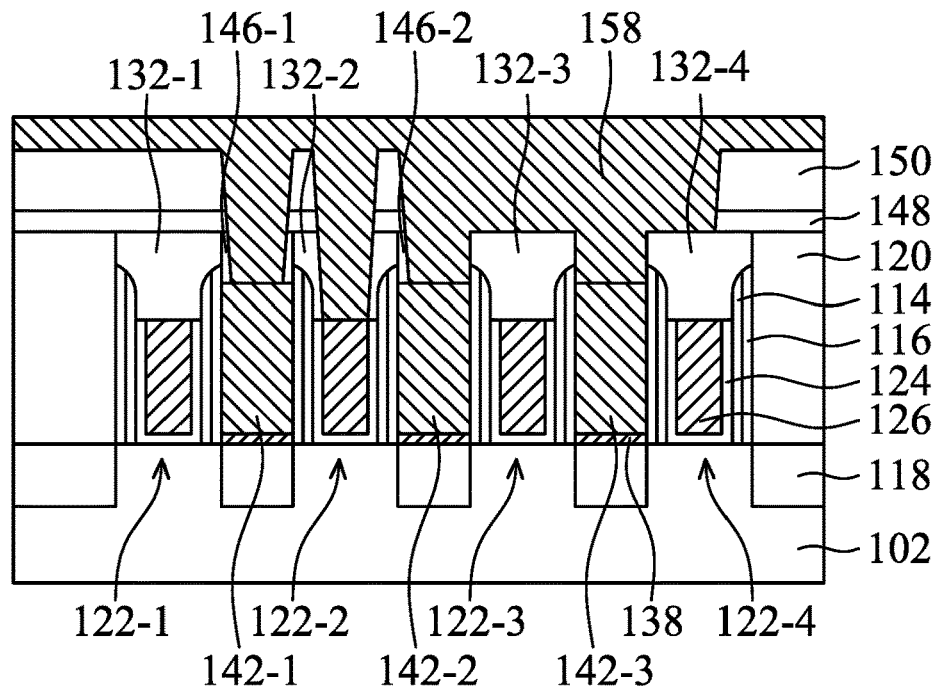
Figure 2P:
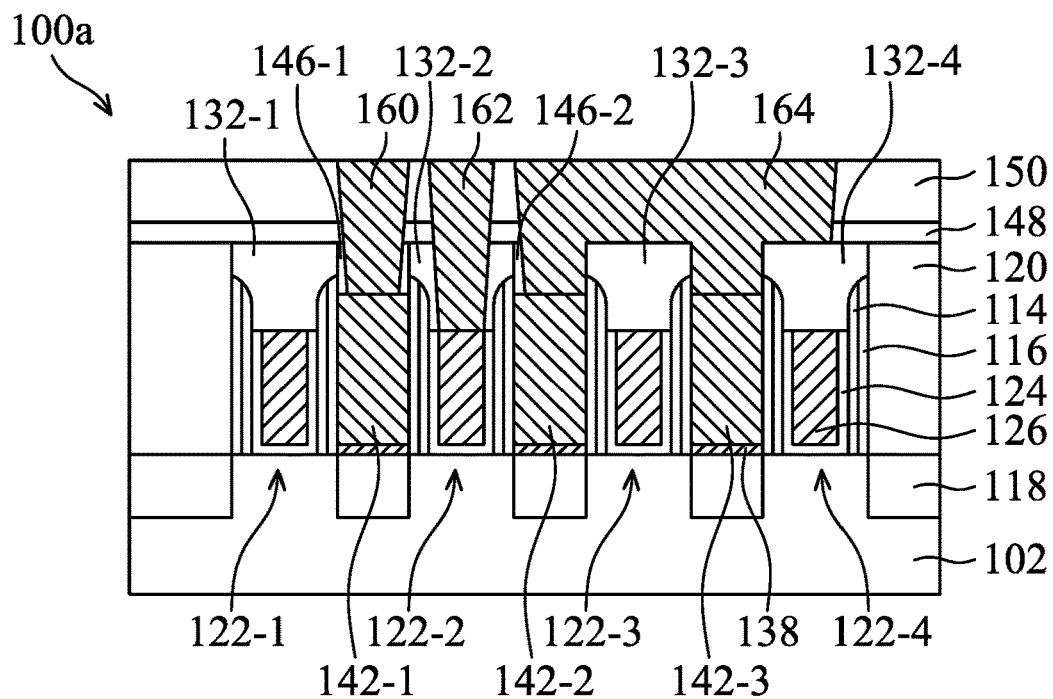

FIGS. 1A to 1D illustrate perspective views of various stages of manufacturing a semiconductor structure and FIGS. 2A to 2P illustrate cross-sectional representations of various stages of manufacturing the semiconductor structure in accordance with some embodiments. In addition, FIGS. 2A to 2D illustrate the cross-sectional representations of the semiconductor structure shown along line A-A' in FIGS. 1A to 1D in accordance with some embodiments.

As show in FIGS. 1A and 2A, a fin structure 104 is formed over a substrate 102 in accordance with some embodiments. The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP. In some embodiments, the fin structure 104 is made of SiGe.

In some embodiments, the fin structure 104 is formed by patterning the substrate 102. In some embodiments, the fin structure 104 has a narrow top portion and a wide bottom portion and therefore has slope sidewalls, as shown in FIG. 1A. In some embodiments, the semiconductor structure is an NMOS device, and the fin structure 104 includes Si, SiP, SiC, SiPC, InP, GaAs, AlAs, InAs, InAlAs, InGaAs, or the like. In some embodiments, the semiconductor structure is a PMOS device, and the fin structure 104 includes Si, SiGe, SiGeB, Ge, InSb, GaSb, InGaSb, or the like.

After the fin structure 104 is formed, an isolation structure 106 is formed over the substrate 102, and the fin structure 104 is surrounded by the isolation structure 106, as shown in FIG. 1A in accordance with some embodiments. The isolation structure 106 may be formed by depositing an insulating layer over the substrate 102 and recessing the insulating layer. In some embodiments, the isolation structure 106 is made of silicon oxide, silicon nitride, silicon oxynitride, fluoride-doped silicate glass (FSG), or other low-K dielectric materials.

Next, dummy gate structures 108-1, 108-2, 108-3, and 108-4 are formed across the fin structure 104 and extend onto the isolation structure 106, as shown in FIGS. 1A and 2A in accordance with some embodiments. In some embodiments, each of the dummy gate structures 108-1, 108-2, 108-3, and 108-4 include a gate dielectric layer 110 and a gate electrode layer 112 formed over the gate dielectric layer 110. In some embodiments, the gate dielectric layer 110 is made of silicon oxide. In some embodiments, the gate electrode layer 112 is made of polysilicon.

After the dummy gate structures 108-1, 108-2, 108-3, and 108-4 are formed, sealing layers 114 and gate spacers 116 are formed on the sidewalls of the dummy gate structures 108-1, 108-2, 108-3, and 108-4, as shown in FIGS. 1A and 2A in accordance with some embodiments. The sealing layers 114 may protect dummy gate structure 108-1, 108-2, 108-3, and 108-4 from damage or loss during subsequent processing and may also prevent oxidation during subsequent processing. In some embodiments, the sealing layers 114 are made of silicon nitride, silicon oxide, silicon oxynitride, silicon carbide, or other applicable dielectric materials. The sealing layers 114 may include a single layer or multiple layers.

The gate spacers 116 are formed on the sealing layers 114 in accordance with some embodiments. In some embodiments, the gate spacers 116 are made of silicon nitride, silicon oxide, silicon carbide, silicon oxynitride, or other applicable materials.

Next, source/drain structures 118 are formed in the fin structure adjacent to the dummy gate structures 108-1, 108-2, 108-3, and 108-4, as shown in FIGS. 1A and 2A in accordance with some embodiments. The source/drain structures 114 may be formed by recessing the fin structure 104 and growing semiconductor materials in the recesses by performing epitaxial (epi) processes. In some embodiments, the semiconductor structure is an NMOS device, and the source/drain structure 118 includes Si, SiP, SiC, SiPC, InP, GaAs, AlAs, InAs, InAlAs, InGaAs, or the like. In some embodiments, the semiconductor structure is a PMOS device, and the source/drain structure 118 includes Si, SiGe, SiGeB, Ge, InSb, GaSb, InGaSb, or the like. In some embodiments, the thickness of the source/drain structure 118 is in a range from about 3 nm to about 30 nm.

After the source/drain structures 118 are formed, an interlayer dielectric (ILD) layer 120 is formed to cover the source/drain structures 118 and the isolation structure 106, as shown in FIGS. 1B and 2B in accordance with some embodiments. The interlayer dielectric layer 120 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The interlayer dielectric layer 120 may be formed by chemical vapor deposition (CVD), physical vapor deposition, (PVD), atomic layer deposition (ALD), or other applicable processes.

After the interlayer dielectric layer 120 is formed, the dummy gate structures 108-1, 108-2, 108-3, and 108-4 are replaced by metal gate structures 122-1, 122-2, 122-3, and 122-4, as shown in FIGS. 1B and 2B in accordance with some embodiments. In some embodiments, each of the metal gate structures 122-1, 122-2, 122-3, and 122-4 includes a gate dielectric layer 124 and a gate electrode layer 126.

In some embodiments, the gate dielectric layer 124 is made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials.

In some embodiments, the gate electrode layer 146 is made of a conductive material, such as aluminum, copper, tungsten, titanium, tantalum, or other applicable materials. The metal gate structures 122-1, 122-2, 122-3, and 122-4 may further includes a work functional layer between the gate dielectric layer 124 and the gate electrodes layer 146 so the metal gate structures 122 may have the proper work function values.

Next, the metal gate structures 122-1, 122-2, 122-3, and 122-4 are etched back to form recesses 128 by performing an etching process 130, as shown in FIGS. 1C and 2C in accordance with some embodiments. In addition, top portions of the sealing layers 114 and gate spacers 116 are also etched during the etching process 130, so that sidewalls of the interlayer dielectric layer 120 are exposed by the recesses 128 in accordance with some embodiments. In some embodiments, the top surface of the gate spacer 116 is higher than the top surface of the sealing layer 114, and the top surface of the sealing layer 114 is higher than the top surface of the metal gate structures 122-1, 122-2, 122-3, and 122-4.

After the recesses 128 are formed, mask structures 132-1, 132-2, 132-3, and 132-4 are formed in the recesses 128 over the metal gate structures 122-1, 122-2, 122-3, and 122-4, as shown in FIGS. 1D and 2D in accordance with some embodiments. The mask structures 132-1, 132-2, 132-3, and 132-4 may protect the metal gate structures 122-1, 122-2, 122-3, and 122-4 in the subsequent manufacturing processes (e.g. etching processes). In some embodiments, the mask structures 132-1, 132-2, 132-3, and 132-4 are made of silicon oxide or silicon nitride. In some embodiments, the mask structures 132-1, 132-2, 132-3, and 132-4 are made of $ZrO_2$, $SiO_2$, or the like.

In some embodiments, at least one of the mask structures 132-1, 132-2, 132-3, and 132-4 extends over and in direct contact with the top surfaces of the sealing layer 114 and the gate spacer 116, such that its top width is greater than its bottom width. In some embodiments, at least one of the mask structures 132-1, 132-2, 132-3, and 132-4 covers and in direct contact with the sidewalls of the interlayer dielectric layer 120.

After the mask structures 132-1, 132-2, 132-3, and 132-4 are formed, a dielectric layer 134 is formed over the interlayer dielectric layer 120 and the mask structures 132-1, 132-2, 132-3, and 132-4, as shown in FIG. 2E in accordance with some embodiments. In some embodiments, the dielectric layer 134 are made of silicon oxide, silicon nitride, silicon oxynitride, phosphosilicate glass (PSG), borophosphosilicate glass (BPSG), and/or other applicable low-k dielectric materials. The dielectric layer 134 may be formed by chemical vapor deposition (CVD), physical vapor deposition, (PVD), atomic layer deposition (ALD), or other applicable processes.

Next, an opening 136 is formed through the dielectric layer 134 and the interlayer dielectric layer 120 to expose the top surfaces of source/drain structures 118, as shown in FIG. 2F in accordance with some embodiments. In some embodiments, the opening 136 is formed by etching the dielectric layer 134 and the interlayer dielectric layer 120. In addition, although some portions of the mask structures 132-1, 132-2, 132-3, and 132-4 may also be etched during the etching process for forming the opening 136, the metal gate structures 122-1, 122-2, 122-3, and 122-4 are still protected by the mask structures 132-1, 132-2, 132-3, and 132-4.

After the opening 136 is formed, a salicide layer 138 is formed over the exposed top surface of the source/drain structures 118, and the opening 136 is filled with a conductive material 140, as shown in FIG. 2G in accordance with some embodiments. The salicide layer 138 may be formed by forming a metal layer over the top surface of the source/drain structures 118 and annealing the metal layer so the metal layer reacts with the source/drain structures 118 to form the salicide layer 138. Examples for forming the metal layer includes Ti, Co, Ni, NiCo, Pt, Ni(Pt), Ir, Pt(Ir), Er, Yb, Pd, Rh, Nb, TiSiN, and the like. In some embodiments, the thickness of the salicide layer 138 is in a range from about 2 nm to about 10 nm.

In some embodiments, the conductive material 140 is Ru, Ir, Ni, Os, Rh, Al, Mo, W, Co, or the like. The conductive material 140 may be formed by chemical vapor deposition (CVD), physical vapor deposition, (PVD), atomic layer deposition (ALD), Electroless deposition (ELD), Electrochemical plating (ECP), or other applicable processes. In some embodiments, the conductive material 140 is formed by performing a CVD process at a temperature of in a range from about 50° C. to about 500° C. In addition, Ar or $N_2$ is used as the carrier gas in the CVD processes and the flow rate of the carrier gas is in a range from about 10 sccm to about 500 sccm.

After the conductive material 140 is formed, a polishing process is performed to form contacts 142-1, 142-2, and 142-3 over the salicide layer 138 over the source/drain structures 118, as shown in FIG. 2H in accordance with some embodiments. In some embodiments, the polishing process is performed on the conductive material 140 until the mask structures 132-1, 132-2, 132-3, and 132-4 are exposed, such that the top surfaces of the contacts 142-1, 142-2, and 142-3 are substantially level with the top surfaces of the mask structures 132-1, 132-2, 132-3, and 132-4. In addition, some portions of the mask structures 132-1, 132-2, 132-3, and 132-4 may also polished and removed during the polishing process. In some embodiments, the thickness of each of the contacts 142-1, 142-2, and 142-3 is in a range from about 0.5 nm to about 90 nm.

In some embodiments, the contacts 142-1, 142-2, and 142-3 are made of Ru. Since Ru may be directly deposited in the opening 136, formation of a barrier layer before depositing Ru may not be required. Therefore, the resulting contacts 142-1, 142-2, and 142-3 may have a lower resistance.

Next, the contacts 142-1, 142-2, and 142-3 are etched to form recesses 144 between the mask structures 132, so that the top surfaces of the contacts 142-1, 142-2, and 142-3 become lower than the top surfaces of the mask structures 132-1, 132-2, 132-3, and 132-4, as shown in FIG. 2I in accordance with some embodiments.

Afterwards, metal-containing layers 146-1, 146-2, and 146-3 are selectively deposited over the contacts 142-1, 142-2, and 142-3, as shown in FIG. 2J in accordance with some embodiments. The metal-containing layers 146-1, 146-2, and 146-3 may be used as hard mask structures in subsequent manufacturing process (e.g. etching processes). In some embodiments, the metal-containing layers 146-1, 146-2, and 146-3 and the mask structures 132-1, 132-2, 132-3, and 132-4 are made of different materials. In some embodiments, the metal-containing layers 146-1, 146-2, and 146-3 are made of metal oxide or metal nitride, and the mask structures 132-1, 132-2, 132-3, and 132-4 are made of silicon oxide or silicon nitride.

In some embodiments, the metal-containing layers 146-1, 146-2, and 146-3 and the contacts 142-1, 142-2, and 142-3 are made of different materials. In some embodiments, the metal-containing layers 146-1, 146-2, and 146-3 include a first metal and the contact 142-1, 142-2, and 142-3 include a second metal that is different than the first metal.

In some embodiments, the metal-containing layers 146-1, 146-2, and 146-3 are made of hafnium oxide, aluminium oxide, ruthenium oxide, titanium oxide, tungsten oxide, yttrium oxide, lanthanum oxide, magnesium oxide, lithium oxide, vanadium oxide, ytterbium oxide, molybdenum oxide, or gadolinium oxide.

In some embodiments, a selective deposition process 148 is performed to form the metal-containing layers metal-containing layers 146-1, 146-2, and 146-3. In some embodiments, the selective deposition process 148 is a pulsed mode ALD or CVD process with a reactive agent for catalytic activation. In some embodiments, the selective deposition process 148 includes applying a reactive agent and a metallic compound onto the contacts 142-1, 142-2, and 142-3 and the mask structures 132-1, 132-2, 132-3, and 132-4. The reactive agent may tend to have a greater adhesion to a conductive material than to a dielectric material, so that most of the reactive agent may adhere onto the top surface of the contacts 142-1, 142-2, and 142-3. Therefore, the metallic compound can react with the reactive agent adhering onto the top surface of the contacts 142-1, 142-2, and 142-3 to form the metal-containing layers 146-1, 146-2, and 146-3 on the top surface of the contacts 142-1, 142-2, and 142-3.

In some embodiments, the reactive agent includes $O_2$ or $NH_3$. In some embodiments, the metallic compound comprises Hf, Al, Ru, Ti, W, Y, La, Mg, Li, V, Yb, Mo, or Gd, and the metal-containing layers 146-1, 146-2, and 146-3 are oxide or nitride of Hf, Al, Ru, Ti, W, Y, La, Mg, Li, V, Yb, Mo, or Gd.

In some embodiments, the reactive agent is $O_2$, and metallic compound includes $TiCl_4$, tetrakis(dimethylamido)titanium (TDMAT), tetrakis(diethylamido)titanium (TDEAT), tetrakis(ethylmethylamido)titanium (TEMAT), or a combination thereof. In these embodiments, $O_2$ may be absorbed by the top surface of the contacts 142-1, 142-2, and 142-3, and the Ti containing compound may react with $O_2$ to form a $TiO_2$ layer on the etched contacts 142' as the metal-containing layers 146-1, 146-2, and 146-3.

In some embodiments, the reactive agent is $O_2$, and metallic compound includes $HfCl_4$, $[(CH_2CH_3)_2N]_4Hf$, or a combination thereof. In these embodiments, a $HfO_2$ layer is formed on the contacts 142-1, 142-2, and 142-3 as the metal-containing layers 146-1, 146-2, and 146-3.

In some embodiments, the reactive agent is $O_2$, and metallic compound includes $[Ru(tfa)_3]$ with cyclo-hexdiene, carbonyl based Ru precursors such as $Ru(CO)x$ or $[Ru(CO)_3C_6H_8]_7$, $[Ru(acac)_3]$, $[Ru(CO)_2 (hfac)_2]$, or a combination thereof. In these embodiments, a $RuO_2$ layer is formed on the contacts 142-1, 142-2, and 142-3 as the metal-containing layers 146-1, 146-2, and 146-3.

Since the metal-containing layers 146-1, 146-2, and 146-3 are selectively deposited on top of the contacts 142-1, 142-2, and 142-3, additional patterning processes and polishing processes are not required. Therefore, the manufacturing processes may be simplified.

In some embodiments, the thickness of each of the metal-containing layers 146-1, 146-2, and 146-3 is in a range from about 0.5 nm to about 4 nm. As described above, since the metal-containing layers 146-1, 146-2, and 146-3 may be used as a mask structure in subsequent etching processes, the metal-containing layer 146 should be thick enough to protect the contacts 142' below it. On the other hand, the metal-containing layers 146-1, 146-2, and 146-3 may not be too thick, or the metal-containing layer s 146-1, 146-2, and 146-3 may further extends onto and cover the top surfaces of the mask structures 132-1, 132-2, 132-3, and 132-4. In some embodiments, the top surfaces of the metal-containing layers 146-1, 146-2, and 146-3 are substantially level with the top surfaces of the mask structures 132-1, 132-2, 132-3, and 132-4.

After the metal-containing layers 146-1, 146-2, and 146-3 are formed, an etch stop layer 148 is formed over the mask structures 132-1, 132-2, 132-3, and 132-4, the metal-containing layers 146-1, 146-2, and 146-3, and the interlayer dielectric layer 120, and a dielectric layer 150 is formed over the etch stop layer 148, as shown in FIG. 2K in accordance with some embodiments.

In some embodiments, the etch stop layer 148 is made of SiN, SiCN, SiOC, SiON, SiCN, or SiOCN. The etch stop layer 148 may be formed by performing plasma enhanced CVD, low pressure CVD, ALD, or other applicable processes. In some embodiments, the thickness of the etch stop layer 148 is in a range from about 1 nm to about 10 nm.

The dielectric layer 150 may include multilayers made of multiple dielectric materials, such as $SiO_2$, SiOC, $ZrO_2$, $HfO_2$, and/or other applicable dielectric materials. The dielectric layer 150 may be formed by performing chemical vapor deposition (CVD), physical vapor deposition, (PVD), atomic layer deposition (ALD), spin-on coating, or other applicable processes. In some embodiments, the thickness of the dielectric layer 150 is in a range from about 1 nm to about 10 nm.

After the dielectric layer 150 is formed, a first trench 152 is formed through the dielectric layer 150, the etch stop layer 148, and the metal-containing layer 146-1 to expose the top surface of the contacts 142-1, as shown in FIG. 2L in accordance with some embodiments. More specifically, an etching process may be performed to form an opening through the dielectric layer 150 and the etching process may be stopped when the etch stop layer 148 is exposed. Afterwards, another etching process may be performed through the opening to etch the metal-containing layer 146-1 exposed by the opening until the top surface of the contacts 142-1 is exposed.

Next, a second trench 154 is formed through the dielectric layer 150, the etch stop layer 148, and the mask structure 132-2 to expose the top surface of the gate structures 122-2, as shown in FIG. 2M in accordance with some embodiments. Similarly, an etching process may be performed to form an opening through the dielectric layer 150 and the etching process may be stopped when the etch stop layer 148 is exposed. Afterwards, another etching process may be performed to etch the mask structure 132-2 exposed by the opening until the top surface of the gate structures 122-2 is exposed.

Next, a third trench 156 is formed through the dielectric layer 150, the etch stop layer 148, as shown in FIG. 2N in accordance with some embodiments. Similarly, an etching process may be performed to form an opening through the dielectric layer 150 and the etching process may be stopped when the etch stop layer 148 is exposed. In addition, the opening may expose the metal-containing layers 146-2 and 146-3 and the mask structures 132-3 and 132-4. Afterwards, another etching process is performed through the opening to remove the exposed metal-containing layers 146-2 and 146-3 while using the mask structures 132-3 and 132-4 to protect the gate structures 122-3 and 122-4.

As described previously, the mask structures 132-3 and 132-4 may be made of silicon oxide or silicon nitride and the metal-containing layers 146-2 and 146-3 may be made of metallic oxide or metallic nitride. That it, the mask structures 132-3 and 132-4 and the metal-containing layers 146-2 and 146-3 may have relatively high etching selectivity. Therefore, the material loss of the mask structures 132-3 and 132-4 during the etching process for forming the third trench 156 may be reduce. Accordingly, the metal gate structures 122-3 and 122-4 can be well protected by the mask structures 132-3 and 132-4 during the etching process for forming the third trench 156, and risk of electrical short of the metal gate structures 122-3 and 122-4 and the contacts 142-2 and 142-3 may be reduced.

After the first trench 152, the second trench 154, and the third trench 156 are formed, a pre-cleaning process may be performed to clean the exposed surfaces in the first trench 152, the second trench 154, and the third trench 156. Afterwards, a conductive material 158 is formed to fill in the first trench 152, the second trench 154, and the third trench 156, as shown in FIG. 2O in accordance with some embodiments. In addition, the conductive material 158 is formed over the top surface of the dielectric layer 150 in accordance with some embodiments.

In some embodiments, the conductive material 158 includes Co, Cu, Ru, Ni, Al, Pt, Mo, W, Al, Ir, Os, or the like. The conductive material 158 may be formed by chemical vapor deposition (CVD), physical vapor deposition, (PVD), atomic layer deposition (ALD), Electroless deposition (ELD), Electrochemical plating (ECP), or other applicable processes. In some embodiments, the conductive material 158 is formed by performing a CVD process at a temperature of in a range from about 50° C. to about 500° C. In addition, Ar or $N_2$ is used as the carrier gas in the CVD processes and the flow rate of the carrier gas is in a range from about 10 sccm to about 500 sccm.

Afterwards, a polishing process is performed on the conductive material 158 until the top surface of the dielectric layer 150 is exposed to form a semiconductor structure 100a with a first conductive structure 160, a second conductive structure 162, and a third conductive structure 164, as shown in FIG. 2P in accordance with some embodiments.

More specifically, the first conductive structure 160 is formed over the contact 142-1, in accordance with some embodiments. In addition, some portions of the metal-containing layer 146-1 may still remain at the bottom portion of the first conductive structure 160 in accordance with some embodiments.

The second conductive structure 162 is formed over the gate structure 122-2, in accordance with some embodiments. In addition, some portions of the mask structure 132-2 may still remain at the bottom portion of the second conductive structure 162 in accordance with some embodiments.

The third conductive structure 164 is formed overlapping with the gate structures 122-3 and 122-4 and the contacts 142-2 and 142-3 in accordance with some embodiments. In addition, the third conductive structure 164 is in direct contact with the contacts 142-2 and 142-3 but is separated from the gate structures 122-3 and 122-4 by the mask structures 132-3 and 132-4 in accordance with some embodiments.

In some embodiments, the first conductive structure 160 and the second conductive structure 162 are separated by the metal-containing layer 146-1 and the mask structure 132-2. In addition, the metal-containing layer 146-1 is in direct contact with the mask structure 132-2 in accordance with some embodiments.

In some embodiments, the second conductive structure 162 and the third conductive structure 164 are separated by the metal-containing layer 146-2 and the mask structure 132-2. In addition, the metal-containing layer 146-2 is in direct contact with the mask structure 132-2 in accordance with some embodiments.

Figure 3A:
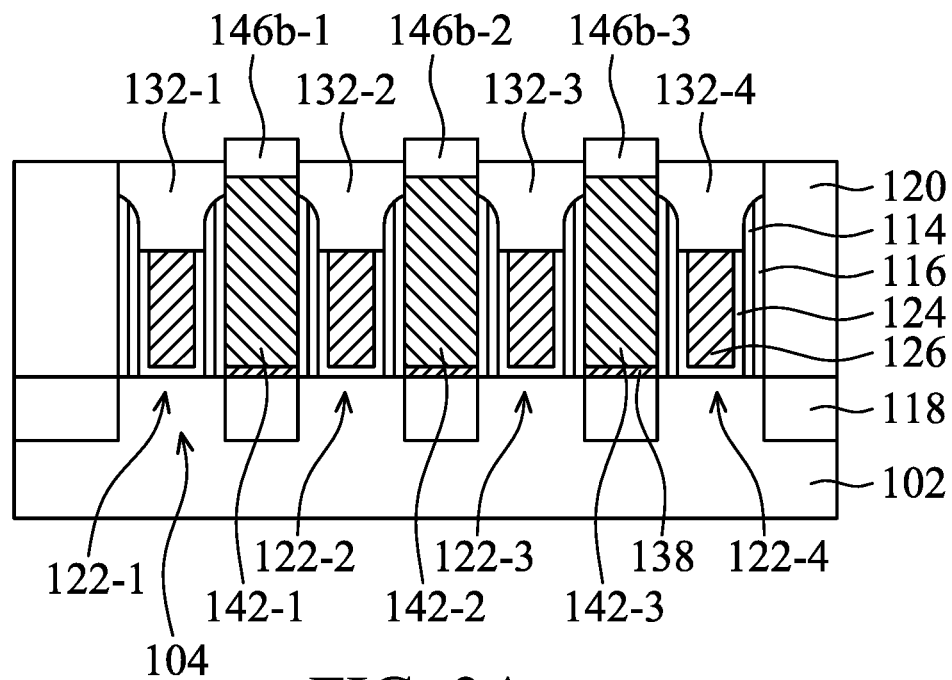
FIGS. 3A and 3B illustrate cross-sectional representations of forming a semiconductor structure in accordance with some embodiments.
Figure 3B:
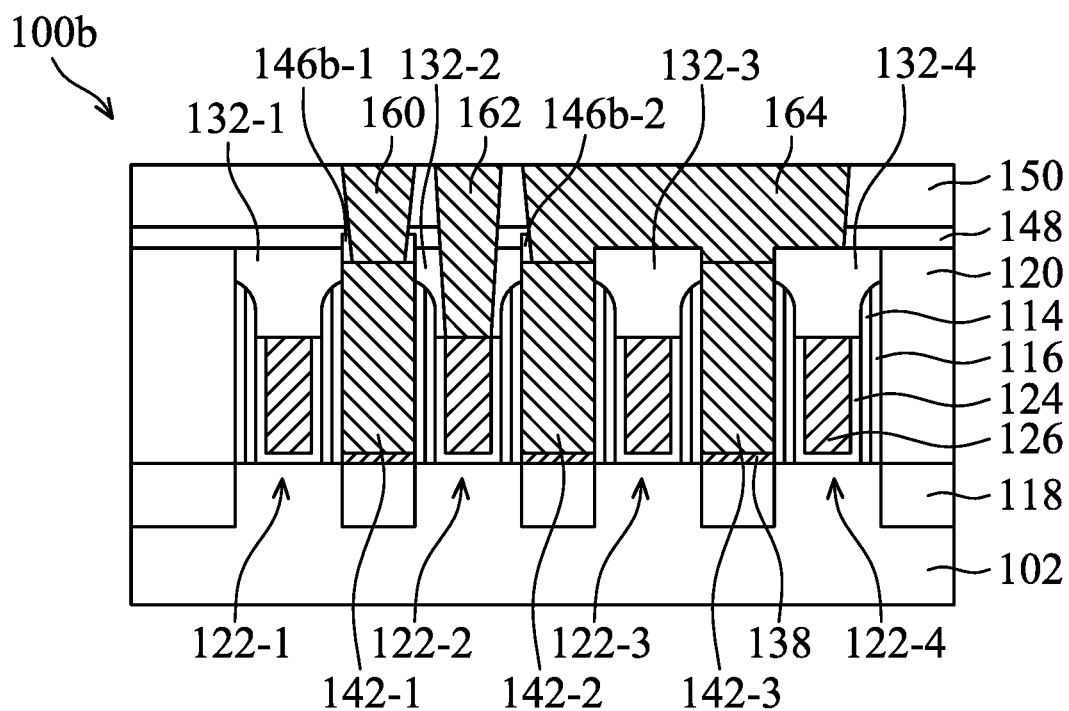

FIGS. 3A and 3B illustrate cross-sectional representations of forming a semiconductor structure 100b in accordance with some embodiments. Processes and materials for forming the semiconductor structure 100b may be similar to, or the same as, those for forming the semiconductor structure 100a described above, except metal-containing layers 146b-1, 146b-2, and 146b-3 in the semiconductor structure 100b are thicker than the metal-containing layers 146-1, 146-2, and 146-3 in the semiconductor structure 100a.

More specifically, processes shown in FIGS. 2A to 2I may be performed, and the metal-containing layers 146b-1, 146b-2, and 146b-3 are selectively grown over the contacts 142-1, 142-2, and 142-3, as shown in FIG. 3A in accordance with some embodiments. In addition, the top surfaces of the metal-containing layers 146b-1, 146b-2, and 146b-3 are higher than the top surfaces of the mask structures 132-1, 132-2, 132-3, and 132-4 and are also higher than the top surface of the interlayer dielectric layer 120 in accordance with some embodiments. After the metal-containing layers 146b-1, 146b-2, and 146b-3 are formed, processes shown in FIGS. 2K to 2P may be performed to form the semiconductor structure 100b, and the processes are not repeated herein.

Figure 4A:
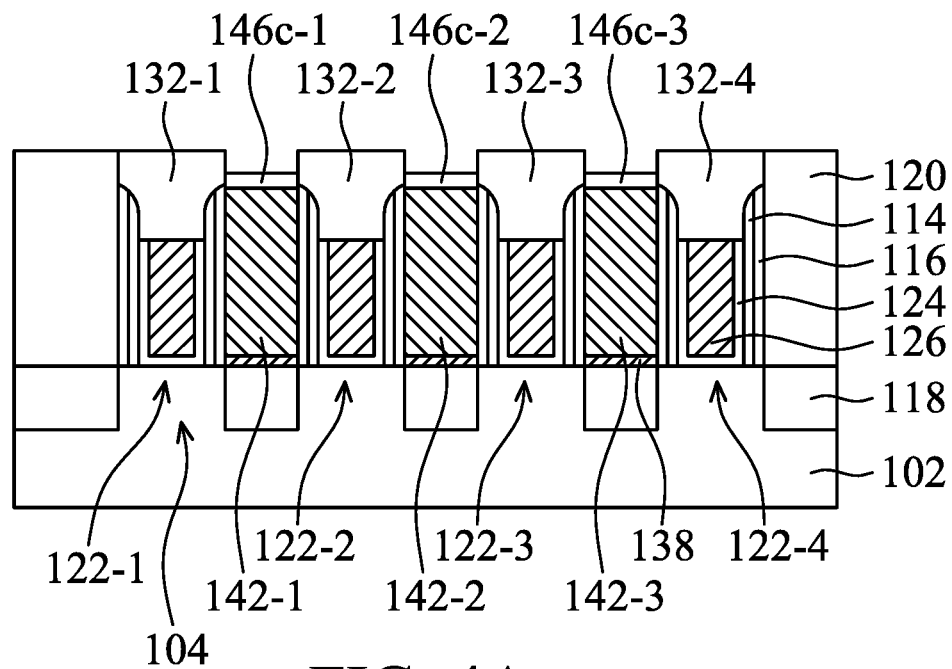
FIGS. 4A and 4B illustrate cross-sectional representations of forming a semiconductor structure in accordance with some embodiments.
Figure 4B:
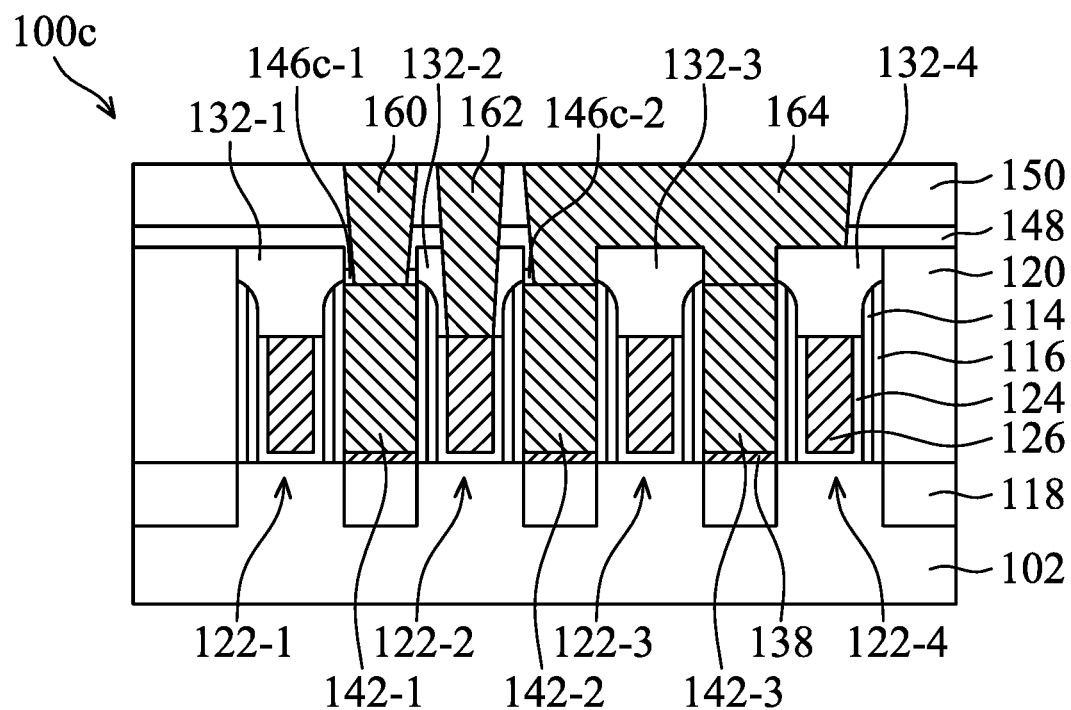

FIGS. 4A and 4B illustrate cross-sectional representations of forming a semiconductor structure 100c in accordance with some embodiments. Processes and materials for forming the semiconductor structure 100c may be similar to, or the same as, those for forming the semiconductor structure 100a described above, except metal-containing layers 146c-1, 146c-2, and 146c-3 in the semiconductor structure 100c are thinner than the metal-containing layers 146-1, 146-2, and 146-3 in the semiconductor structure 100a.

More specifically, processes shown in FIGS. 2A to 2I may be performed, and the metal-containing layers 146c-1, 146c-2, and 146c-3 are selectively grown over the contacts 142-1, 142-2, and 142-3, as shown in FIG. 4A in accordance with some embodiments. In addition, the top surfaces of the metal-containing layers 146c-1, 146c-2, and 146c-3 are lower than the top surfaces of the mask structures 132-1, 132-2, 132-3, and 132-4 and are also lower than the top surface of the interlayer dielectric layer 120 in accordance with some embodiments. After the metal-containing layers 146c-1, 146c-2, and 146c-3 are formed, processes shown in FIGS. 2K to 2P may be performed to form the semiconductor structure 100b, and the processes are not repeated herein.

Figure 5A:
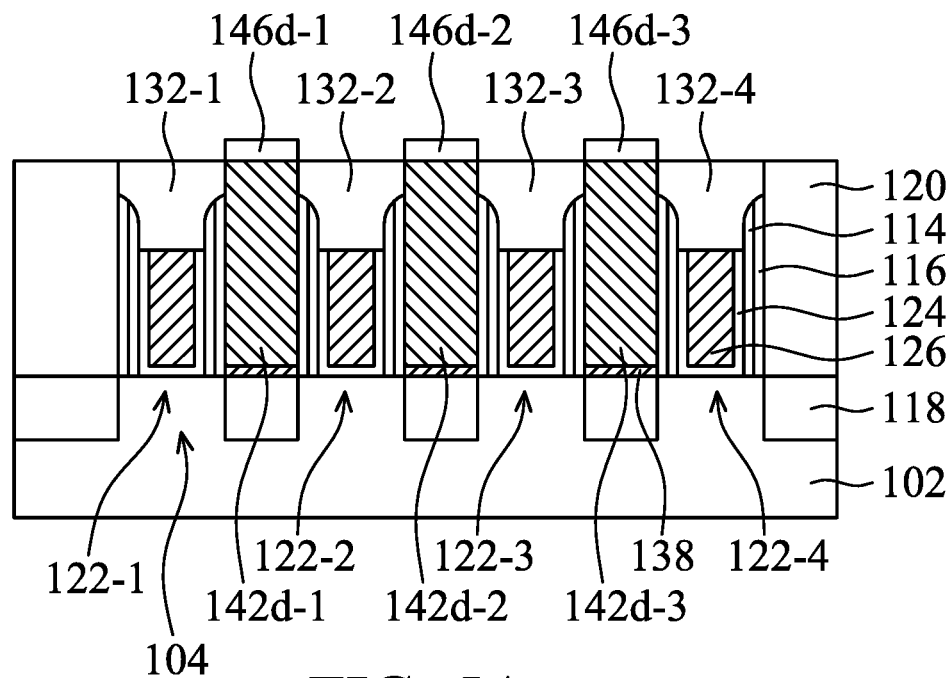
FIGS. 5A and 5B illustrate cross-sectional representations of forming a semiconductor structure in accordance with some embodiments.
Figure 5B:
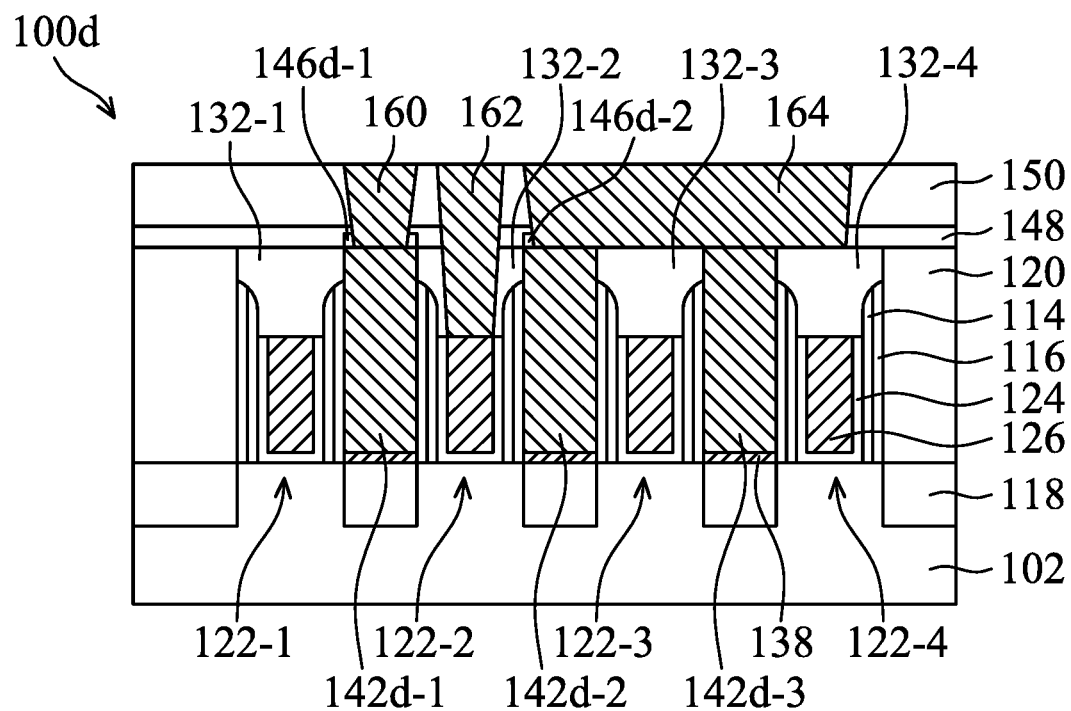

FIGS. 5A and 5B illustrate cross-sectional representations of forming a semiconductor structure 100d in accordance with some embodiments. Processes and materials for forming the semiconductor structure 100d may be similar to, or the same as, those for forming the semiconductor structure 100a described above, except contacts 142d-1, 142d-2, and 142d-3 are not recessed before forming metal-containing layers 146d-1, 146d-2, and 146d-3.

More specifically, processes shown in FIGS. 2A to 2H may be performed, and the metal-containing layers 146d-1, 146d-2, and 146d-3 are selectively grown over the contacts 142d-1, 142d-2, and 142d-3, as shown in FIG. 5A in accordance with some embodiments. Since the contacts 142d-1, 142d-2, and 142d-3 are not recessed before forming the metal-containing layers 146d-1, 146d-2, and 146d-3, the bottom surfaces of the metal-containing layers 146d-1, 146d-2, and 146d-3 are substantially level with the top surfaces of the mask structures 132-1, 132-2, 132-3, and 132-4 and are also substantially level with the top surface of the interlayer dielectric layer 120 in accordance with some embodiments. That is, the top surfaces of the metal-containing layers 146d-1, 146d-2, and 146d-3 are higher than the top surfaces of the mask structures 132-1, 132-2, 132-3, and 132-4 in accordance with some embodiments.

After the metal-containing layers 146d-1, 146d-2, and 146d-3 are formed, processes shown in FIGS. 2K to 2P may be performed to form the semiconductor structure 100d, and the processes are not repeated herein.

Figure 6:
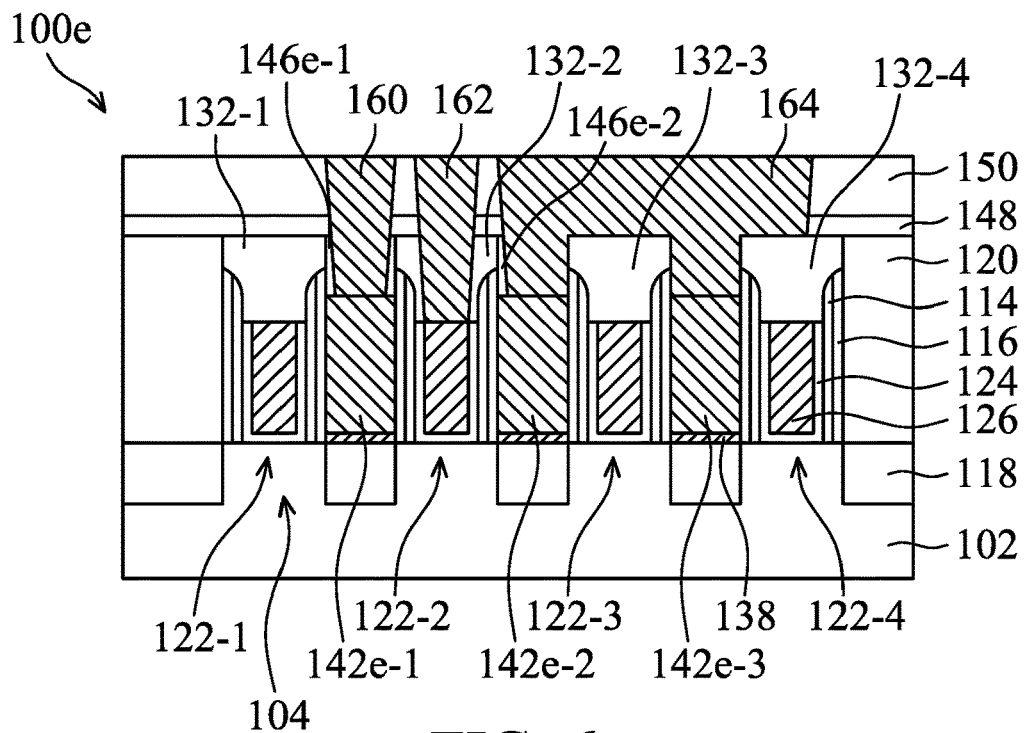
FIG. 6 illustrates a cross-sectional representation of a semiconductor structure in accordance with some embodiments.

FIG. 6 illustrates a cross-sectional representation of a semiconductor structure 100e in accordance with some embodiments. Processes and materials for forming the semiconductor structure 100e may be similar to, or the same as, those for forming the semiconductor structure 100d described above, except metal-containing layers 146e-1, 146e-2, and 146e-3 are formed oxidizing contacts 142e-1, 142e-2, and 142e-3.

More specifically, processes shown in FIGS. 2A to 2H may be performed to form the contacts 142e-1, 142e-2, and 142e-3, and the metal-containing layers are formed by oxidizing the contacts 142e-1, 142e-2, and 142e-3, as shown in FIG. 6 in accordance with some embodiments. As shown in FIG. 6, the top surfaces of the metal-containing layers 146e-1 and 146e-2 are substantially level with the top surfaces of the mask structures 132-1, 132-2, 132-3, and 132-4 in accordance with some embodiments. After the metal-containing layers 146e-1 and 146e-2 are formed, processes shown in FIGS. 2K to 2P may be performed to form the semiconductor structure 100e, and the processes are not repeated herein.

Figure 7:
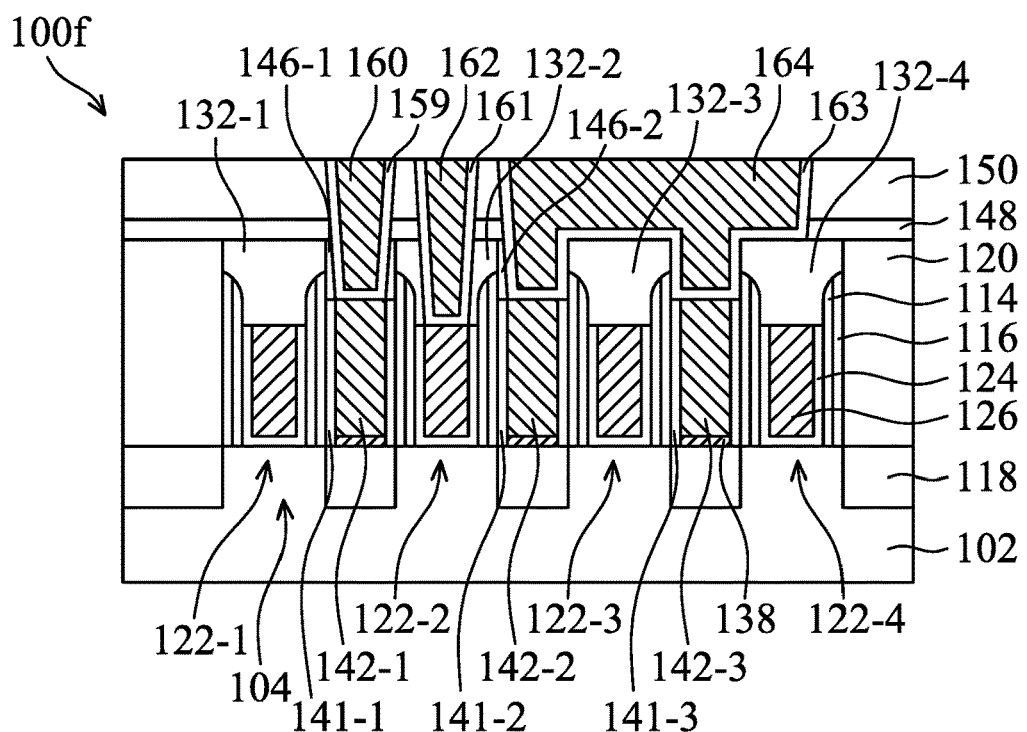
FIG. 7 illustrates a cross-sectional representation of a semiconductor structure in accordance with some embodiments.

FIG. 7 illustrates a cross-sectional representation of a semiconductor structure 100f in accordance with some embodiments. Processes and materials for forming the semiconductor structure 100f may be similar to, or the same as, those for forming the semiconductor structure 100a described above, except contact barrier layers 141-1, 141-2, and 141-3 are formed before the contacts 142-1, 142-2, and 142-3 are formed and via barrier layers 159, 161, and 163 are formed before the first conductive structure 160, the second conductive structure 162, and the third conductive structure 164 are formed.

In some embodiments, the contact barrier layers 141-1, 141-2, and 141-3 and the via barrier layers 159, 161, and 163 are made of W, Mo, Ir, Pt, Os, TiN, TaN, or the like. In some embodiments, the thickness of each of the contact barrier layers 141-1, 141-2, and 141-3 and the via barrier layers 159, 161, and 163 is in a range of about 0.5 nm to about 5 nm.

Generally, mask structures may be formed over the gate structures and contacts to protect them during subsequent manufacturing processes (e.g. etching processes). As described previously, the metal-containing layers (e.g. the metal-containing layers 146-1 to 146-3, 146b-1 to 146b-3, 146c-1 to 146c-3, 146d-1 to 146d-3, 146e-1, and 146e-2) are formed over the contacts (e.g. the contacts 142-1 to 142-3 and 142e-1 to 142e-3) as mask structures in accordance with some embodiment. Since the metal-containing layers are selectively formed (e.g. by performing selective deposition process), additional patterning and polishing processes may not be required. Therefore, the manufacturing processes may be simplified.

In addition, in some embodiments, the mask structures (e.g. the mask structures 132-1 to 132-4) are made of silicon oxide or silicon nitride, which has relatively high etching selectivity with the metal-containing layers. Therefore, formation of trenches for forming conductive structure (e.g. the first conductive structure 160, the second conductive structure 162, and the third conductive structure 164) may have a wider process window.

Furthermore, since the mask structures and metal-containing layers have relatively high etching selectivity, the material loss of the mask structures during the etching process for forming trenches, such as the third trench 156, may be reduced. Accordingly, the metal gate structures can be well protected by the mask structures, and risk of electrical short of the metal gate structures and the contacts may be reduced.

Although semiconductor structures 100a to 100f are FinFET structures, the processes described above (e.g. the selective deposition process) may also be applied to 2D transistors, multi-gate transistors, gate-all-around transistors, nano-wire transistors, nano-sheet transistors, or other applicable semiconductor structures, and the concepts of the application are not intended to be limiting.

Embodiments for forming semiconductor structures are provided. The method may include forming a mask structure over a gate structure and forming a metal-containing layer over a contact connecting to a source/drain structure. In addition, the metal-containing layer may be selectively formed over the contact without using additional patterning and/or polishing process, and therefore the manufacturing processes for forming the semiconductor structure may be simplified. Furthermore, the mask structure and the metal-containing layer may have relatively high etching selectivity, and risk for electrical short between the gate structure and the contact may be reduced.

In some embodiments, a semiconductor structure is provided. The semiconductor structure includes a substrate and a gate structure formed over the substrate. The semiconductor structure further includes a source/drain structure formed adjacent to the gate structure in the substrate and a contact formed over the source/drain structure. The semiconductor structure further includes a metal-containing layer formed over the contact and a dielectric layer covering the gate structure and the metal-containing layer. The semiconductor structure further includes a first conductive structure formed through dielectric layer and the metal-containing layer and landing on the contact. In addition, a bottom surface of the metal-containing layer is higher than a top surface of the gate structure.

In some embodiments, a semiconductor structure is provided. The semiconductor structure includes a substrate and a gate structure formed over the substrate. The semiconductor structure further includes a mask structure formed over the gate structure and a source/drain structure formed adjacent to the gate structure in the substrate. The semiconductor structure further includes a contact formed over the source/drain structure and a metal-containing layer formed over the contact. The semiconductor structure further includes a first conductive structure formed through the metal-containing layer over the contact. In addition, the mask structure is thicker than the metal-containing layer.

In some embodiments, a semiconductor structure is provided. The semiconductor structure includes a substrate and a gate structure formed over the substrate. The semiconductor structure further includes a mask structure formed over the gate structure. In addition, a top portion of the mask structure is wider than a bottom portion of the mask structure. The semiconductor structure further includes a first source/drain structure formed at a first side of the gate structure and a first contact formed over the first source/drain structure. The semiconductor structure further includes a first metal-containing layer formed over the first contact and a spacer sandwiched between the first contact and the gate structure. In addition, the top portion of the mask structure is in direct contact with the first metal-containing layer and a portion of the spacer is sandwiched between the bottom portion of the mask structure and the first contact.

In some embodiments, a method for forming a semiconductor structure is provided. The method includes forming a gate structure over a substrate and forming a source/drain structure adjacent to the gate structure. The method further includes forming a mask structure over the gate structure and forming a contact over the source/drain structure. The method further includes selectively forming a metal-containing layer over a top surface of the contact and forming a dielectric layer over the substrate and covering the gate structure and the contact. The method further includes forming a trench through the dielectric layer and the metal-containing layer to expose the top surface of the contact and forming a conductive structure in the trench.

In some embodiments, a method for forming a semiconductor structure is provided. The method includes forming a fin structure over a substrate and forming a gate structure across the fin structure. The method further includes forming a source/drain structure in the fin structure adjacent to the gate structure and forming an interlayer dielectric layer around the gate structure over the substrate. The method further includes forming a mask structure over the gate structure and forming a contact through the interlayer dielectric layer over the source/drain structure. The method further includes selectively depositing a metal-containing layer over the contact and forming a dielectric layer over the interlayer dielectric layer. The method further includes etching the dielectric layer and the metal-containing layer to form a trench exposing a top surface of the contact and forming a conductive structure in the trench.

In some embodiments, a method for forming a semiconductor structure is provided. The method includes forming a fin structure over a substrate and forming a first gate structure across the fin structure. The method further includes forming a first source/drain structure in the fin structure at a first side of the first gate structure and forming a first mask structure over the first gate structure. The method further includes forming a first contact over the first source/drain structure and applying a reactive agent and a metallic compound over the first contact to form a first metal-containing layer over a top surface of the first contact. The method further includes forming a dielectric layer covering the first mask structure and the first metal-containing layer and forming a first conductive structure through the dielectric layer and the first metal-containing layer, so that the first conductive structure is in direct contact with the first contact.

The fins described above may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a gate structure formed over the substrate;
   a source/drain structure formed adjacent to the gate structure in the substrate;
   a contact formed over the source/drain structure;
   a metal-containing layer formed over the contact;
   a dielectric layer covering the gate structure and the metal-containing layer; and
   a first conductive structure formed through dielectric layer and the metal-containing layer and landing on the contact,
   wherein a bottom surface of the metal-containing layer is higher than a top surface of the gate structure.

2. The semiconductor structure as claimed in claim 1, further comprising:
   a mask structure formed over the gate structure, wherein the mask structure is covered by the dielectric layer.

3. The semiconductor structure as claimed in claim 2, further comprising:
   a second conductive structure formed through the dielectric layer and the mask structure and landing on the gate structure.

4. The semiconductor structure as claimed in claim 3, wherein a top surface of the first conductive structure is substantially level with a top surface of the second conductive structure.

5. The semiconductor structure as claimed in claim 2, wherein a top surface of the mask structure is substantially level with a top surface of the metal-containing layer.

6. The semiconductor structure as claimed in claim 2, wherein a top surface of the mask structure is higher than or lower than a top surface of the metal-containing layer.

7. The semiconductor structure as claimed in claim 1, further comprising:
   a spacer formed on a sidewall of the gate structure, wherein a top portion of the spacer is lower than a top surface of the mask structure.

8. A semiconductor structure, comprising:
   a substrate;
   a gate structure formed over the substrate;
   a mask structure formed over the gate structure;
   a source/drain structure formed adjacent to the gate structure in the substrate;
   a contact formed over the source/drain structure;
   a metal-containing layer formed over the contact;
   a first conductive structure formed through the metal-containing layer over the contact,
   wherein the mask structure is thicker than the metal-containing layer.

9. The semiconductor structure as claimed in claim 8, further comprising:
   a spacer sandwiched between the gate structure and the contact, wherein the spacer has a first height closer to the contact and a second height closer to the gate structure, and the first height is greater than the second height.

10. The semiconductor structure as claimed in claim 8, further comprising:
    a second conductive structure formed through the mask structure over the gate structure, wherein a first interface between the first conductive structure and the contact is higher than a second interface between the second conductive structure and the gate structure.

11. The semiconductor structure as claimed in claim 10, wherein the first conductive structure and the second conductive structure are separated by the mask structure and the metal-containing layer.

12. The semiconductor structure as claimed in claim 8, wherein the mask structure is in direct contact with the metal-containing layer.

13. The semiconductor structure as claimed in claim 8, wherein a top portion of the mask structure is wider than a bottom portion of the mask structure.

14. A semiconductor structure, comprising:
    a substrate;
    a gate structure formed over the substrate;
    a mask structure formed over the gate structure, wherein a top portion of the mask structure is wider than a bottom portion of the mask structure;
    a first source/drain structure formed at a first side of the gate structure;
    a first contact formed over the first source/drain structure;
    a first metal-containing layer formed over the first contact; and
    a spacer sandwiched between the first contact and the gate structure,
    wherein the top portion of the mask structure is in direct contact with the first metal-containing layer and a portion of the spacer is sandwiched between the bottom portion of the mask structure and the first contact.

15. The semiconductor structure as claimed in claim 14, further comprising:
- a second source/drain structure formed at a second side of the gate structure; and
- a second contact formed over the second source/drain structure,
- wherein the mask structure is sandwiched between the first contact and the second contact.

16. The semiconductor structure as claimed in claim 15, further comprising:
- a first conductive structure in direct contact with a top surface of the first contact and a top surface of the second contact.

17. The semiconductor structure as claimed in claim 16, wherein the first conductive structure is in contact with the mask structure.

18. The semiconductor structure as claimed in claim 14, wherein a top surface of the mask structure is lower than a top surface of the first metal-containing layer and higher than a bottom surface of the first metal-containing layer.

19. The semiconductor structure as claimed in claim 14, wherein a top surface of the mask structure is substantially level with a top surface of the first contact.

20. The semiconductor structure as claimed in claim 14, wherein the mask structure is thicker than the metal-containing layer.

* * * * *